United States Patent
Kim et al.

(10) Patent No.: US 12,495,680 B2
(45) Date of Patent: Dec. 9, 2025

(54) DISPLAY DEVICE AND MANUFACTURING METHOD THEREOF

(71) Applicant: SAMSUNG DISPLAY CO., LTD., Yongin-si (KR)

(72) Inventors: Sang Gyun Kim, Hwaseong-si (KR); Dae Woong Lee, Seoul (KR); Ill Hun Cho, Seoul (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 196 days.

(21) Appl. No.: 17/463,304

(22) Filed: Aug. 31, 2021

(65) Prior Publication Data

US 2022/0149317 A1    May 12, 2022

(30) Foreign Application Priority Data

Nov. 11, 2020   (KR) .................. 10-2020-0150212

(51) Int. Cl.
| | |
|---|---|
| *H01L 51/52* | (2006.01) |
| *H10K 59/122* | (2023.01) |
| *H10K 59/124* | (2023.01) |
| *H10K 59/80* | (2023.01) |
| *H10K 59/12* | (2023.01) |
| *H10K 59/123* | (2023.01) |
| *H10K 71/00* | (2023.01) |

(52) U.S. Cl.
CPC ......... *H10K 59/122* (2023.02); *H10K 59/124* (2023.02); *H10K 59/80522* (2023.02); *H10K 59/1201* (2023.02); *H10K 59/123* (2023.02); *H10K 59/80521* (2023.02); *H10K 71/00* (2023.02)

(58) Field of Classification Search
CPC .. H10K 50/824; H10K 59/122; H10K 59/124; H10K 59/1201; H10K 59/123; H10K 71/00
USPC .......................................................... 257/72
See application file for complete search history.

(56) References Cited

U.S. PATENT DOCUMENTS

| | | |
|---|---|---|
| 7,456,811 B2 | 11/2008 | Kwak |
| 9,035,286 B2 | 5/2015 | Chen et al. |

(Continued)

FOREIGN PATENT DOCUMENTS

| | | |
|---|---|---|
| KR | 10-0573132 | 4/2006 |
| KR | 10-0590259 | 6/2006 |

(Continued)

OTHER PUBLICATIONS

Korean Office Action for Korean Patent Application No. 10-2020-0150212, dated Sep. 12, 2024.

(Continued)

*Primary Examiner* — Dzung Tran
(74) *Attorney, Agent, or Firm* — HARNESS, DICKEY & PIERCE, P.L.C.

(57) ABSTRACT

A display device includes a substrate; a transistor disposed on the substrate; a first electrode connected to the transistor; an auxiliary electrode disposed on the same layer as the first electrode; an emission layer disposed on the first electrode; and a second electrode disposed on the emission layer, wherein the auxiliary electrode includes an opening, and a side surface of the auxiliary electrode and the second electrode are in direct contact at the opening of the auxiliary electrode.

15 Claims, 13 Drawing Sheets

(56) References Cited

U.S. PATENT DOCUMENTS

| | | |
|---|---|---|
| 10,388,905 B2 | 8/2019 | Choi et al. |
| 10,756,293 B2 | 8/2020 | Lee et al. |
| 2009/0309493 A1 | 12/2009 | Seo |
| 2010/0127264 A1* | 5/2010 | Bang .................... H10K 50/828 438/151 |
| 2011/0215329 A1* | 9/2011 | Chung ................ H10K 59/121 257/59 |
| 2014/0183479 A1* | 7/2014 | Park .................. H10K 59/1315 438/34 |
| 2014/0312323 A1* | 10/2014 | Park ................ H10K 59/80516 438/23 |
| 2015/0228697 A1 | 8/2015 | Liu et al. |
| 2015/0318506 A1 | 11/2015 | Zhou et al. |
| 2016/0284785 A1* | 9/2016 | Matsuura ............. H10K 59/131 |
| 2017/0077205 A1* | 3/2017 | Kim ..................... H10K 50/824 |
| 2017/0133620 A1* | 5/2017 | Lee ........................ H10K 50/81 |
| 2017/0186831 A1* | 6/2017 | Nam ..................... H10K 50/814 |
| 2018/0190934 A1* | 7/2018 | Choi .................... H10K 50/824 |
| 2018/0226612 A1* | 8/2018 | Choi .................. H10K 59/8731 |
| 2019/0131365 A1* | 5/2019 | Jung .................. H10K 59/1213 |
| 2020/0067017 A1 | 2/2020 | Seo et al. |

FOREIGN PATENT DOCUMENTS

| | | |
|---|---|---|
| KR | 10-0739143 | 7/2007 |
| KR | 101415794 B1 | 7/2014 |
| KR | 10-2018-0062284 | 6/2018 |
| KR | 10-2018-0077767 | 7/2018 |
| KR | 10-2020-0023585 | 3/2020 |
| KR | 10-2020-0049223 | 5/2020 |

OTHER PUBLICATIONS

Korean Office Action dated May 20, 2025 for corresponding Korean Patent Application No. 10-2020-0150212 and its English-language translation.

* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2020-0150212 filed on Nov. 11, 2020, which is hereby incorporated by reference for all purposes as if fully set forth herein. The present disclosure relates generally to a display device and a manufacturing method thereof.

BACKGROUND

Field

The present disclosure relates generally to a display device and a manufacturing method thereof.

Discussion of the Background

A display device is widely used as a display screen for a laptop computer, a tablet computer, a smart phone, a portable display device, and a portable information device, in addition to a display screen of a television or monitor.

Recently, research and development on a display device that uses a light emitting element have been conducted, and such a display device is spotlighted as a next-generation display because it has high image quality and high reliability. Such a display device is a self-light-emitting device, and has low power consumption, high-speed response, high light emission efficiency, high luminance, and a wide viewing angle. The display device has attracted attention as a next-generation display that is a display that may be mounted on an electronic product or home appliance, such as a television, a monitor, a laptop computer, a smart phone, a tablet computer, an electronic pad, a wearable device, a watch phone, a portable information device, a navigation device, or a vehicle control display device, to display an image.

The display device is also used as a large area display, and in this case, due to high resistance of a cathode electrode made of a transparent conductive metal material, luminance uniformity is deteriorated by a voltage drop (IR drop) of a cathode voltage.

The above information disclosed in this Background section is only for enhancement of understanding of the background of the invention, an therefore it may contain information that does not form the prior art that is already known in this country to a person of ordinary skill in the art.

SUMMARY

Embodiments provide a display device and a manufacturing method thereof that may prevent a voltage drop of a cathode in a large area display device.

Additional features of the inventive concepts will be set forth in the description which follows, and in part will be apparent from the description, or may be learned by practice of the inventive concepts.

In embodiment of the present invention provides a display device including: a substrate; a transistor disposed on the substrate; a first electrode connected to the transistor; an auxiliary electrode disposed on the same layer as the first electrode; an emission layer disposed on the first electrode; and a second electrode disposed on the emission layer, wherein the auxiliary electrode includes an opening, and a side surface of the auxiliary electrode and the second electrode are in direct contact at the opening of the auxiliary electrode.

A groove of the opening of the auxiliary electrode may be disposed at an edge of the auxiliary electrode, and the auxiliary electrode and the second electrode may contact each other in the groove.

A portion of the emission layer may be disposed in an area overlapping the opening of the auxiliary electrode in a direction perpendicular to a surface of the substrate, and the emission layer and the auxiliary electrode may not be in contact.

The display device may further include an insulation film disposed between the transistor and the first electrode, wherein the insulation film may include a first insulation opening overlapping the transistor in a direction perpendicular to a surface of the substrate, and a second insulation opening not overlapping the transistor in the direction perpendicular to the surface of the substrate, while a cross-section of the insulation film disposed between the first insulation opening and the second insulation opening may be curved in the direction perpendicular to the surface of the substrate.

The second insulation opening of the insulation film may overlap the opening of the auxiliary electrode.

The auxiliary electrode and the second electrode may be in direct contact within the second insulation opening of the insulation film.

Another embodiment provides a display device including: a substrate; a plurality of transistors disposed on the substrate; a plurality of first electrodes respectively connected to the plurality of transistors; an auxiliary electrode disposed on the same layer as the plurality of first electrodes and disposed along one direction; an emission layer disposed on the first electrode; and a second electrode having a plate shape disposed on the emission layer, wherein the auxiliary electrode includes an opening in one area, and a side surface of the auxiliary electrode and the second electrode are in direct contact at the opening of the auxiliary electrode.

A groove of the opening of the auxiliary electrode may be disposed at an edge of the auxiliary electrode, and the groove of the auxiliary electrode and the second electrode may be in contact.

The display device may further include an insulation film disposed between the transistor and the first electrode, wherein the insulation film may include an opening overlapping the opening of the auxiliary electrode, while a cross-section of the insulation film adjacent to the opening of the insulation film in a direction perpendicular to a surface of the substrate is curved.

The auxiliary electrode may be disposed along a curved surface of the insulation film.

The emission layer may be disposed within the opening of the insulation film, and the emission layer and the auxiliary electrode may not be in contact.

The second electrode may be disposed in contact with the emission layer in the opening of the insulation film, and the second electrode and the auxiliary electrode may be in contact.

Another embodiment provides a manufacturing method of a display device, including: preparing a substrate on which a transistor is disposed; forming an insulation film including a first insulation opening overlapping the transistor and a second insulation opening not overlapping the transistor, on the transistor; depositing a first electrode material on the insulation film; etching the first electrode material to form an auxiliary electrode including a first electrode and an opening; forming a partition wall on the first electrode and the auxiliary electrode; etching the auxiliary electrode to form a groove in the auxiliary electrode; forming an emission layer on the partition wall; and forming a second electrode on the emission layer, wherein a side surface of the auxiliary electrode and the second electrode are in direct contact at the opening of the auxiliary electrode.

The first electrode and the transistor may contact each other at the first insulation opening of the insulation film, and the second insulation opening of the insulation film and the opening of the auxiliary electrode may overlap each other.

The auxiliary electrode and the second electrode may contact each other at the second insulation opening of the insulation film, and the second electrode may directly contact the groove of the auxiliary electrode.

A cross-section of the insulation film disposed between the first insulation opening and the second insulation opening of the insulation film may be curved in a direction perpendicular to a surface of the substrate.

The partition wall may include an opening overlapping the first electrode in a direction perpendicular to a surface of the substrate, and in the forming of the emission layer on the partition wall, the emission layer may be formed in the opening of the partition wall and the second insulation opening of the insulation film.

The emission layer may not be in contact with the auxiliary electrode in the second insulation opening of the insulation film.

In the forming of the emission layer on the partition wall, a deposition angle of a material of the emission layer may be 40 degrees or more.

In the forming of the second electrode on the emission layer, a deposition angle of a material of the second electrode may be 20 degrees or less.

According to the embodiments, it is possible to provide a display device and a manufacturing method thereof that may prevent a voltage drop of a cathode in a large area display device.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
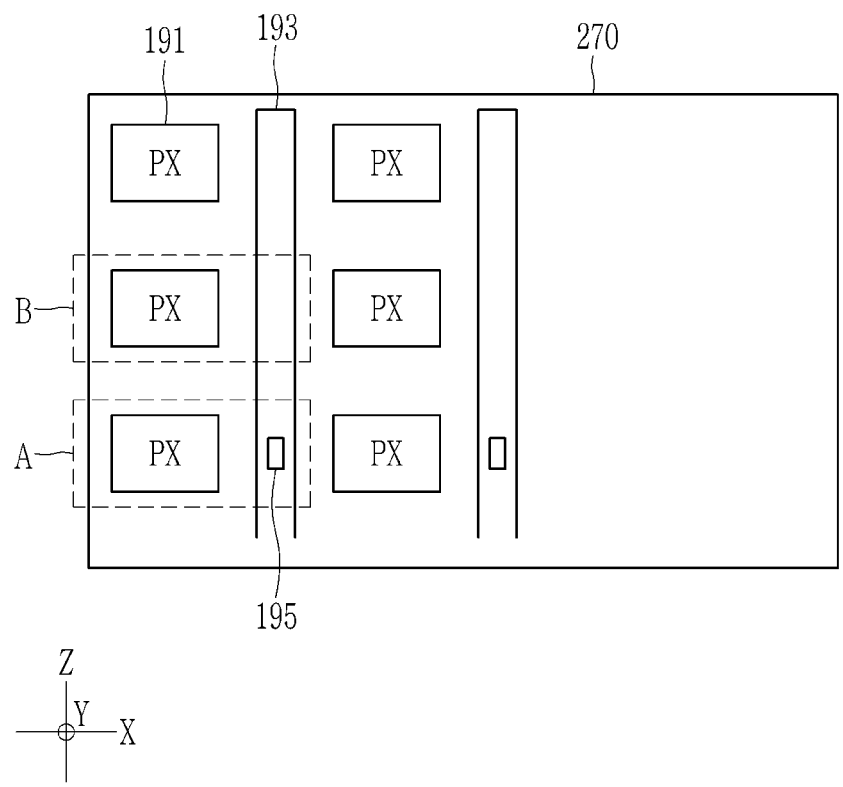
FIG. 1 schematically illustrates a pixel in a configuration of a first electrode, an auxiliary electrode, and a second electrode in a display device according to embodiments described herein.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The X-axis, the Y-axis, and the Z-axis are not limited to three axes of a rectangular coordinate system and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 schematically illustrates a pixel PX along with a configuration of a first electrode 191, an auxiliary electrode 193, and a second electrode 270 in a display device according to an embodiment. Referring to FIG. 1, the display device according to the present embodiment includes first electrodes 191 separately disposed from each other to correspond to each pixel PX. As illustrated herein, the auxiliary electrode 193 is disposed on a same conductive layer as the first electrode 191. The second electrode 270 may have a plate shape that is disposed to overlap the first electrode 191 and the auxiliary electrode 193. Although not illustrated in FIG. 1, in each pixel, the first electrode 191 may be connected to a transistor, and a pixel emission layer may be disposed between the first electrode 191 and the second electrode 270.

As illustrated in FIG. 1, an opening 195 is formed in a portion of the auxiliary electrode 193. When the second electrode 270 contacts the auxiliary electrode 193 at the opening 195, a voltage drop (IR drop) of the second electrode 270 may be prevented. That is, a voltage applied to the second electrode 270 in a large-area display device may decrease depending on an area, but the display device according to the present embodiment prevents such a phenomenon because a portion of the second electrode 270 is in contact with the auxiliary electrode 193.

A detailed contact illustration of the second electrode 270 and the auxiliary electrode 193 will be described in detail with reference to the following drawings.

Figure 2:
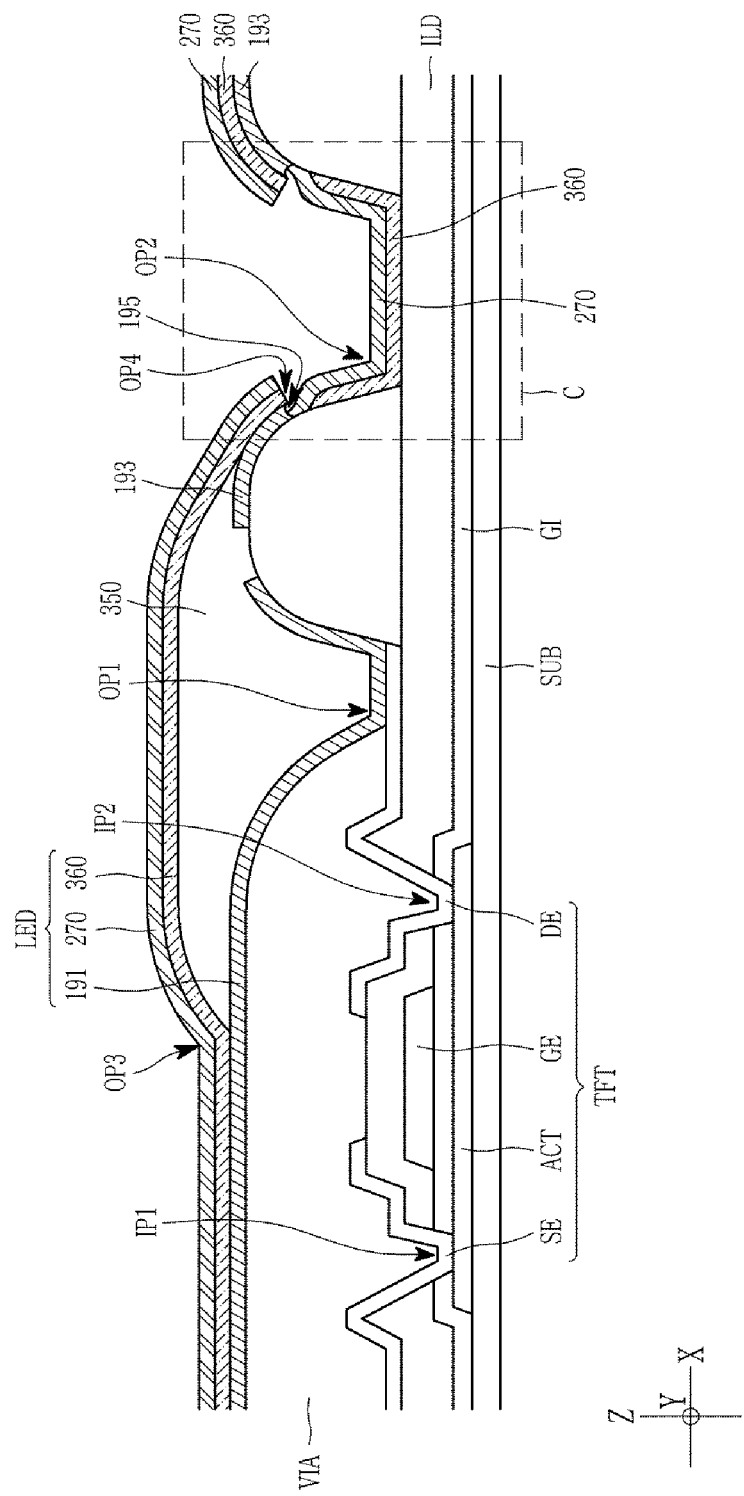
FIG. 2 schematically illustrates a cross-sectional view of a pixel in an area indicated by "A" in FIG. 1.

FIG. 2 schematically illustrates a cross-sectional view of a pixel in an area indicated by dotted lines "A" in FIG. 1. Referring to FIG. 2, the display device according to the present embodiment includes a substrate SUB and a semiconductor layer ACT disposed on the substrate SUB. The semiconductor layer ACT may be a semiconductor active layer.

The substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate SUB may be a rigid substrate, or a flexible substrate that is bendable, foldable, or rollable. The buffer layer SUB may be single-layered or multi-layered. The substrate SUB may be a substrate in which at least one base layer and at least one inorganic layer, which include polymer resins sequentially stacked, are alternately stacked.

The semiconductor layer ACT may include one of amorphous silicon, polycrystalline silicon, and an oxide semiconductor. For example, the semiconductor layer ACT may include a low temperature polycrystalline silicon (LTPS), or an oxide semiconductor material including at least one of zinc (Zn), indium (In), gallium (Ga), tin (Sn), and a mixture thereof. For example, the semiconductor layer may include an indium-gallium-zinc oxide (IGZO).

A gate insulation film GI may be disposed on the semiconductor layer ACT. The gate insulation film GI may include a silicon oxide ($SiO_x$), a silicon nitride (SiNx), or a silicon oxynitride ($SiO_xN_y$), and may have a single-layered or multi-layered structure including the same.

A gate electrode GE may be positioned on the gate insulation film GI. The gate electrode GE may overlap the semiconductor layer ACT in a direction perpendicular to a surface of the substrate SUB. The gate electrode GE may include molybdenum (Mo), aluminum (Al), copper (Cu), titanium (Ti), or a metal oxide thereof, and may have a single layered or multi-layered structure including the same.

An interlayer insulation film ILD may be disposed on the gate electrode GE. The interlayer insulation film ILD may include a silicon oxide ($SiO_x$), a silicon nitride ($SiN_x$), or a silicon oxynitride ($SiO_xN_y$), and may have a single-layered or multi-layered structure including the same. When the interlayer insulation film ILD has a multi-layered structure including a silicon nitride and a silicon oxide, a layer including the silicon nitride may be disposed closer to the substrate SUB than a layer including the silicon oxide.

The interlayer insulation film ILD may include a first interlayer opening IP1 and a second interlayer opening IP2 overlapping the semiconductor layer ACT.

A data conductive layer including a source electrode SE and a drain electrode DE is disposed on the interlayer insulation film ILD. The source electrode SE may contact the semiconductor layer ACT at the first interlayer opening IP1, and the drain electrode DE may contact the semiconductor layer ACT at the second interlayer opening IP2. The data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), or a metal oxide thereof, and may have a single-layered or multi-layered structure including them.

The semiconductor layer ACT, the gate electrode GE, the source electrode SE, and the drain electrode DE form a transistor TFT.

An insulation film VIA may be disposed on the data conductive layer and the interlayer insulation film ILD. The insulation film VIA may include an organic insulating material such as a general purpose polymer such as poly(methyl methacrylate) (PMMA) or polystyrene (PS), a polymer derivative having a phenolic group, an acryl-based polymer, an imide-based polymer, a polyimide, and a siloxane-based polymer.

The insulation film VIA may include a first insulation opening OP1 overlapping the drain electrode DE, and a second insulation opening OP2 adjacent to the insulation film VIA and the drain electrode DE. The second insulation opening OP2 may be disposed to not overlap the drain electrode DE, and may be disposed to not overlap the first electrode 191 in a direction perpendicular to the substrate SUB as illustrated in FIG. 2.

In this case, the insulation film VIA between the first insulation opening OP1 and the second insulation opening OP2 may have a curved cross-section in a direction perpendicular to a surface of the substrate SUB. Because the insulation film VIA near the second insulation opening OP2 has the curved surface, the auxiliary electrode 193 and the second electrode 270 may contact each other as described herein. A specific contact shape thereof will be described later.

Referring to FIG. 2, the first electrode 191 and the auxiliary electrode 193 are disposed on different sections of the insulation film VIA. The first electrode 191 contacts the drain electrode DE at the first insulation opening OP1 of the insulation film VIA. The auxiliary electrode 193 is formed by the same process as the first electrode 191 and is disposed on a same conductive layer as the first electrode 191. The auxiliary electrode 193 may be disposed from left to right along the X-direction as illustrated in FIG. 1, may extend perpendicular to the substrate SUB in the Y-direction in the second insulation opening OP2, and may include the opening 195. FIG. 2 illustrates a cross-sectional view including the opening 195 of the auxiliary electrode 193. The opening 195 of the auxiliary electrode 193 may overlap and be disposed within the second insulation opening OP2 of the insulation film VIA.

The first electrode 191 may be a pixel electrode that receives a pixel voltage from the transistor TFT.

The first electrode 191 and the auxiliary electrode 193 may contain a metal such as silver (Ag), lithium (Li), calcium (Ca), aluminum (Al), magnesium (Mg), or gold (Au), and may also contain a transparent conductive oxide (TCO) such as an indium tin oxide (ITO) or an indium zinc oxide (IZO). The first electrode 191 may be formed of a single layer including a metal material or a transparent conductive oxide, or a multilayer including them. For example, the first electrode 191 may have a triple-layered structure of indium tin oxide (ITO)/silver (Ag)/indium tin oxide (ITO).

Figure 3:
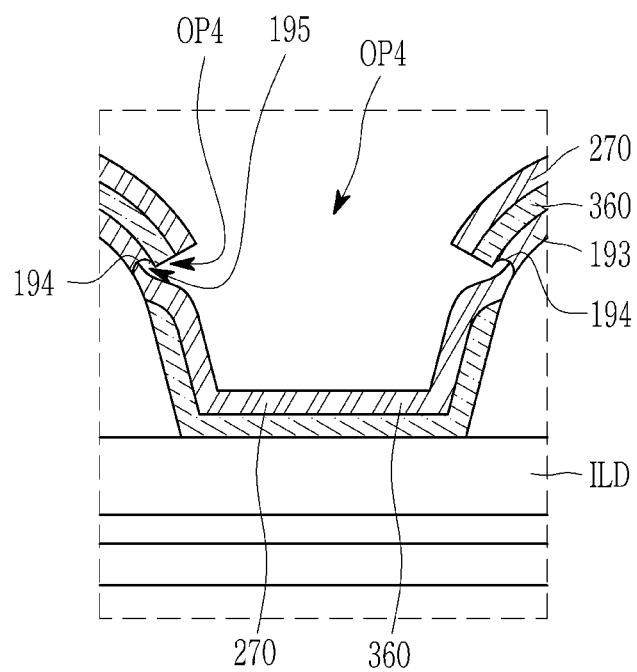
FIG. 3 illustrates an enlarged view of a portion indicated by "C" in FIG. 2.

FIG. 3 illustrates an enlarged view of a portion indicated by the dotted line "C" in FIG. 2. Referring to FIGS. 2 and 3 simultaneously, a groove 194 is formed in one edge of the auxiliary electrode 193. Thereafter, the second electrode 270 and the auxiliary electrode 193 may contact each other in the groove 194 of the auxiliary electrode 193.

A partition wall 350 is disposed on the insulation film VIA. The partition wall 350 includes a third opening OP3 adjacent thereto and overlapping the first electrode 191 in the Y-direction perpendicular to a surface of the substrate SUB. In addition, the partition wall 350 is adjacent a fourth opening OP4 overlapping the second insulation opening OP2 of the insulation film VIA.

An emission layer 360 is disposed on the insulation film VIA and the partition wall 350. The emission layer 360 may be disposed in the third opening OP3 of the partition wall 350, an upper surface of the partition wall 350, and extending into the second insulation opening OP2 of the insulation film VIA.

The emission layer 360 is formed so as to not contact the auxiliary electrode 193 at a bottom of the second insulation opening OP2. This is done by using a thermal deposition angle of an organic material in a deposition process of the emission layer 360.

Referring to FIG. 2 and FIG. 3 simultaneously, the emission layer 360 does not contact the auxiliary electrode 193 in a bottom of the second insulation opening OP2.

As illustrated, the second electrode 270 is formed on the emission layer 360. The second electrode 270 is formed on an upper surface of the emission layer 360, is disposed in the third opening OP3 of the partition wall 350, and is formed in the second insulation opening OP2 of the insulation film VIA.

The second electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or calcium (Ca), or a transparent conductive oxide (TCO) such as an indium tin oxide (ITO) or an indium zinc oxide (IZO).

The second electrode 270 is disposed as a plate in an entire area of the display device, and may be a common electrode supplied with a common voltage.

The first electrode 191, the emission layer 360, and the second electrode 270 may form a light emitting element LED.

Referring to FIG. 3, the second electrode 270 contacts a side surface of the auxiliary electrode 193 in the second insulation opening OP2 of the insulation film VIA. That is, as described herein, the second electrode 270 is formed to connect to the groove 194 of the auxiliary electrode 193 by a heat deposition angle of a metal material. Adjacent an end of the emission layer 360 is a break in the second electrode 270 near an upper portion of the second insulation opening OP2. Towards a middle and lower portion of the second insulation opening OP2, the second electrode 270 contacts the auxiliary electrode 193 in the groove 194.

As such, because the second electrode 270 contacts the auxiliary electrode 193 in the groove 194, a drop of a voltage applied to the second electrode 270 may be prevented. In FIG. 2 and FIG. 3, the second electrode 270 disposed within the second insulation opening OP2 of the insulation film VIA appears to be separated from the second electrode 270 disposed outside the second insulation opening OP2 of the insulation film VIA, but as illustrated in FIG. 1, the second electrode 270 has a plate shape, and the second electrodes 270 are connected to each other at different portions.

Figure 4:
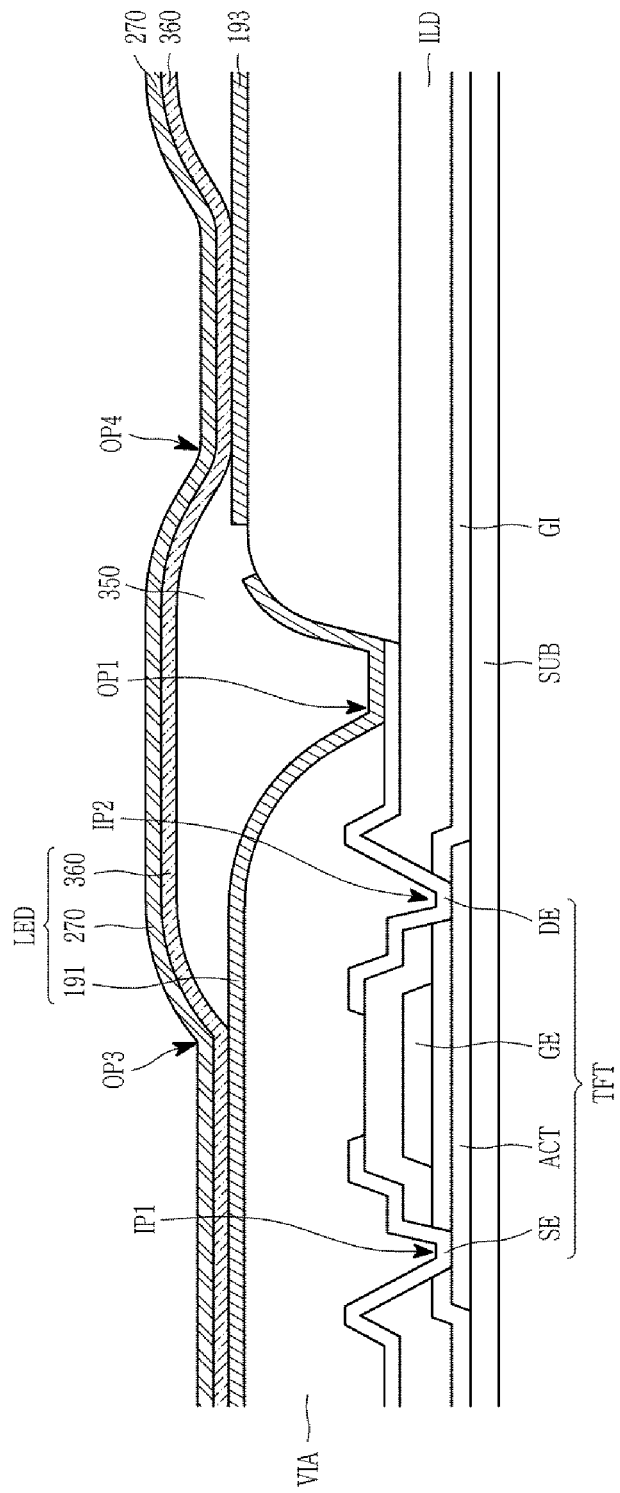
FIG. 4 illustrates a cross-sectional view of a pixel disposed at a portion indicated by "B" in FIG. 1.

FIG. 4 illustrates a cross-sectional view of a pixel disposed at a portion indicated by "B" in FIG. 1. Referring to FIG. 4, a pixel at a corresponding position is the same as that of FIG. 1 except that the insulation film VIA does not include the second insulation opening OP2. Detailed description of the same constituent elements will be omitted. Referring to FIG. 4, the auxiliary electrode 193 does not include an opening, and the emission layer 360 and the second electrode 270 are sequentially disposed on the auxiliary electrode 193.

That is, the display device according to the present embodiment has a feature in which an opening (the second insulation opening OP2) with a curved side surface is formed in the insulation film VIA, and the groove 194 is formed at the edge of the auxiliary electrode 193, so that the auxiliary electrode 193 and the second electrode 270 contact each other. Therefore, in the large-area display device, it is possible to prevent a phenomenon in which a voltage applied to the second electrode 270 of a large area is different for each area.

This is because a deposition angle of the emission layer 360, which is made of an organic material, and a deposition angle of the second electrode 270, which is made of a metal material, are different.

Figure 5:
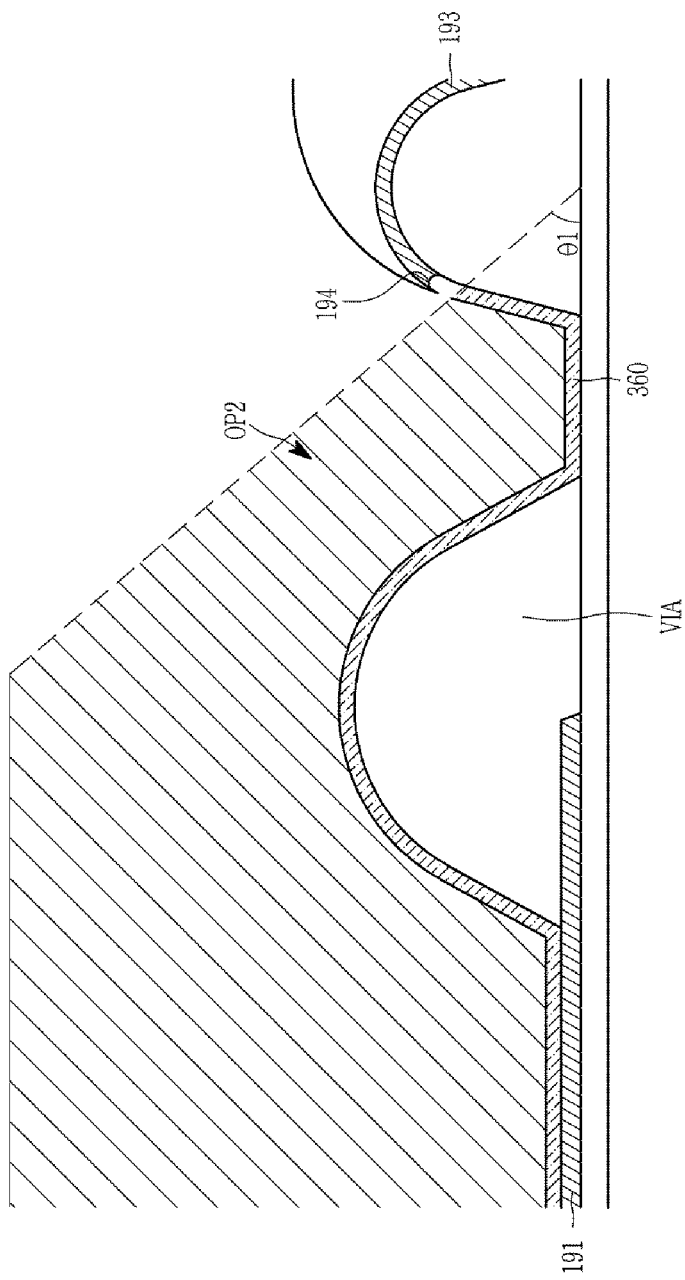
FIG. 5 illustrates an angle at which an emission layer is deposited within an opening of an insulation film.

FIG. 5 illustrates an angle at which the emission layer 360 is deposited within the opening OP2 of the insulation film VIA. The cross-sectional view illustrated in FIG. 5 is a virtual cross-sectional view for convenience of explanation, and only the configurations of the first electrode 191, the auxiliary electrode 193, the insulation film VIA, and the emission layer 360 are illustrated therein. As illustrated in FIG. 5, a deposition angle θ1 of the emission layer 360 may be about 40 degrees or more. Accordingly, the emission layer 360 is not formed in the groove 194 of the auxiliary electrode 193, and the emission layer 360 is formed so as to not contact the auxiliary electrode 193.

Figure 6:
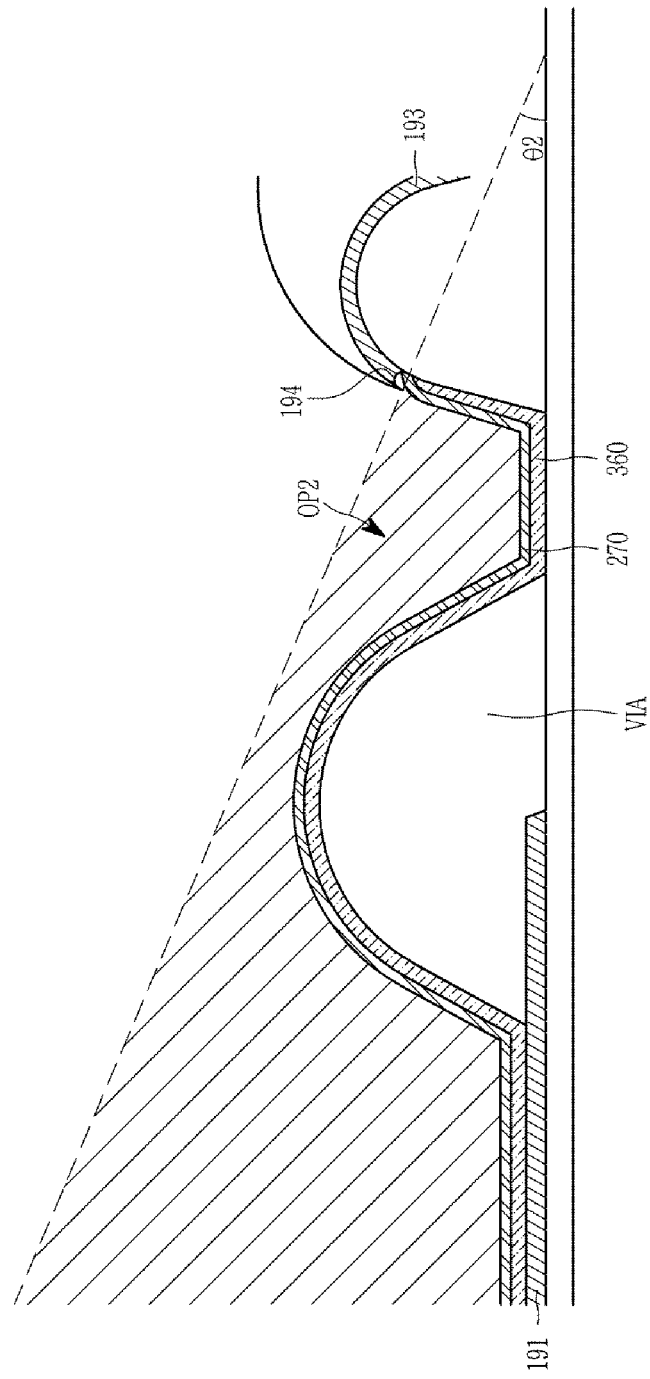
FIG. 6 illustrates an angle at which a second electrode is deposited within an opening of an insulation film.

FIG. 6 illustrates an angle at which the second electrode 270 is deposited within the opening OP2 of the insulation film VIA. The cross-sectional view illustrated in FIG. 6 is a virtual cross-sectional view for convenience of explanation, and only the configurations of the first electrode 191, the auxiliary electrode 193, the insulation film VIA, the emission layer 360, and the second electrode 270 are illustrated therein. As illustrated in FIG. 6, a deposition angle θ2 of the second electrode 270 may be about 20 degrees or less. Accordingly, because the second electrode 270 is deposited at a smaller angle than that of the emission layer 360, it may be formed up to an area in which the emission layer 360 is not formed.

Accordingly, as illustrated in FIG. 6, the second electrode 270 may be formed up to the groove 194 of the auxiliary electrode 193, and may directly contact the auxiliary electrode 193.

As described above, the display device according to the present embodiment has the feature in which the opening with the curved side surface is formed in the insulation film VIA, the groove 194 is formed at the edge of the auxiliary electrode 193, and the deposition angles of the emission layer 360 and the second electrode 270 are different such that the auxiliary electrode 193 and the second electrode 270 contact each other. Therefore, it is possible to alleviate and improve the display characteristic deterioration caused by the voltage drop of the second electrode 270 in the large-area display device.

Hereinafter, a manufacturing method of a display device according to an embodiment of the present invention will be described in detail with reference to the accompanying drawings. FIG. 7 to FIG. 12 illustrate cross-sectional views of a manufacturing process of a display device according to an embodiment.

Figure 7:
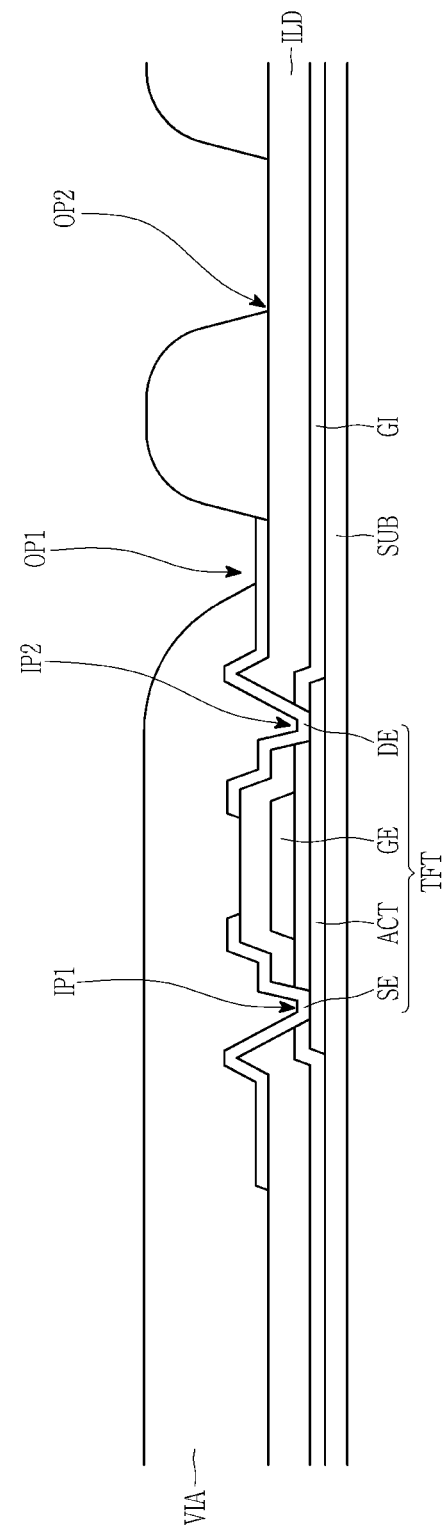
FIGS. 7, 8, 9, 10, 11, and 12 illustrate cross-sectional views of a manufacturing process of a display device according to embodiments described herein.

Referring to FIG. 7, the substrate SUB and the semiconductor layer ACT disposed on the substrate SUB are included. The gate insulation film GI is disposed on the semiconductor layer ACT, and the gate electrode GE and the interlayer insulation film ILD are disposed on the gate insulation film GI. The source electrode SE and the drain electrode DE are disposed on the interlayer insulation film ILD. Descriptions of the substrate SUB, the semiconductor layer ACT, the gate insulation film GI, the gate electrode GE, the interlayer insulation film ILD, the source electrode SE, and the drain electrode DE are the same as those described above with reference to FIG. 1, so detailed description of the same constituent elements will be omitted.

Referring to FIG. 7, the insulation film VIA includes the first insulation opening OP1 overlapping the drain electrode DE and the second insulation opening OP2 not overlapping the drain electrode DE. The first insulation opening OP1 is an area in which the first electrode 191, which will be described later, is in contact with the drain electrode DE, and the second insulation opening OP2 is an area in which the auxiliary electrode 193 and the second electrode 270 contact each other.

As illustrated in FIG. 7, the insulation film VIA between the first insulation opening OP1 and the second insulation opening OP2 has a curved cross-section in a Y-direction perpendicular to the surface of the substrate SUB. The auxiliary electrode 193 and the second electrode 270 may contact each other by using an inclined surface of the insulation film VIA having the curved surface in the second insulation opening OP2.

Figure 8:
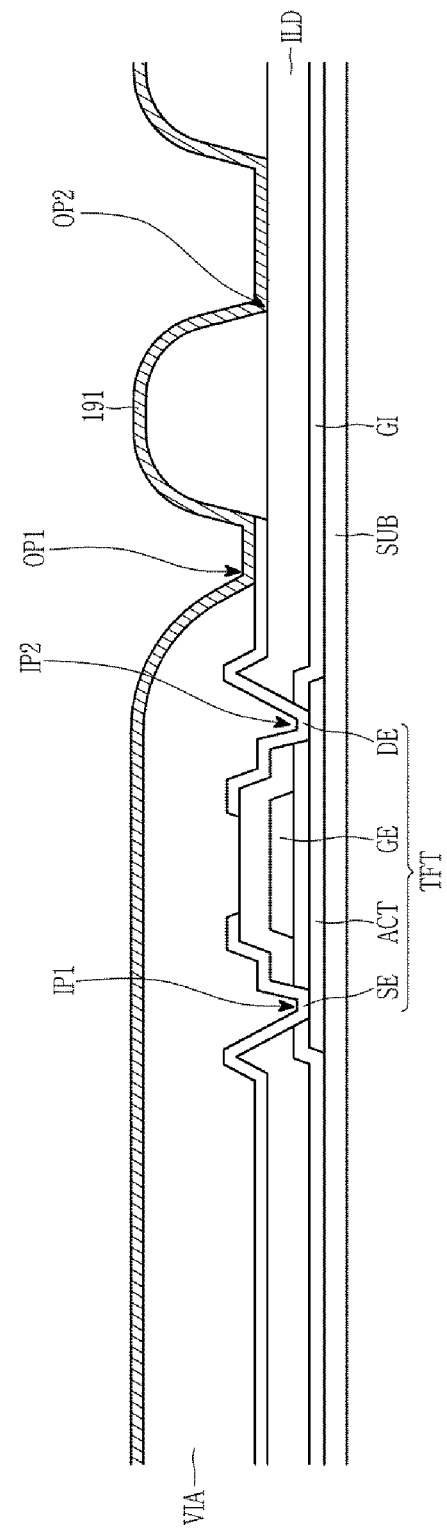

Referring to FIG. 8, the first electrode 191 is formed on the insulation film VIA. In this case, the first electrode 191 is formed on an entire surface including the first insulation opening OP1 and the second insulation opening OP2 of the insulation film VIA.

Figure 9:
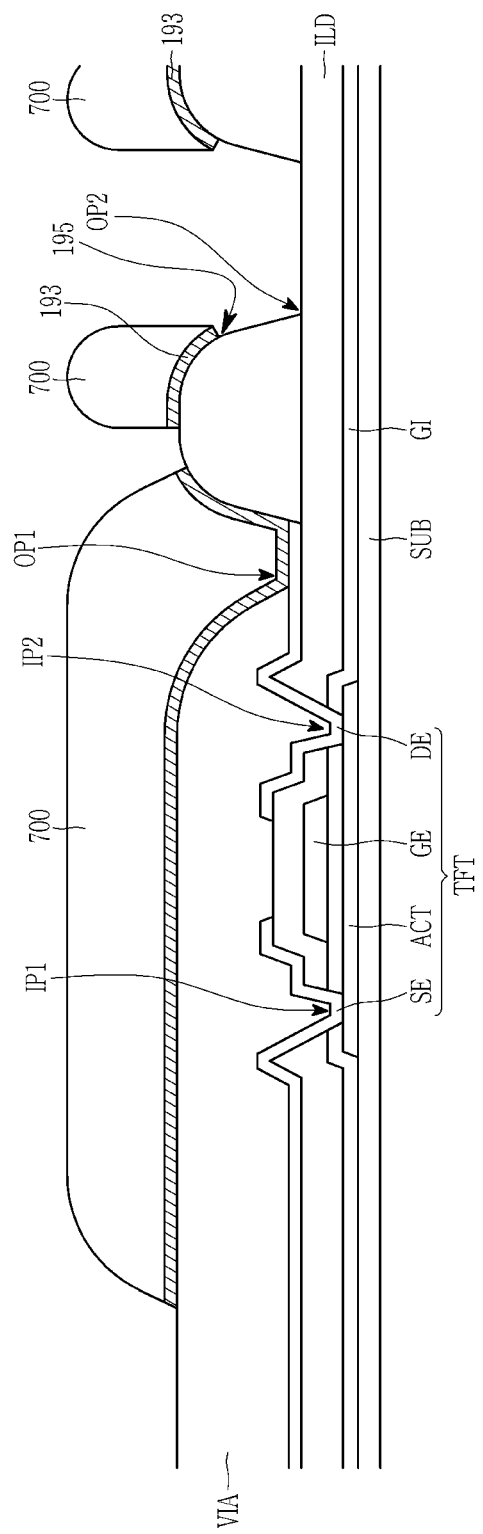

Next, referring to FIG. 9, a photoresist 700 is disposed on segments of the first electrode 191 to form the first electrode 191 and the auxiliary electrode 193 such as is illustrated in FIG. 2. As illustrated in FIG. 9, a portion of the first electrode 191 is etched to form the auxiliary electrode 193. A center of the auxiliary electrode 193 in the opening OP2 is provided to have the opening 195. Thereafter, the second electrode 270 is able to contact the auxiliary electrode 193 in the opening 195 of the auxiliary electrode 193.

Figure 10:
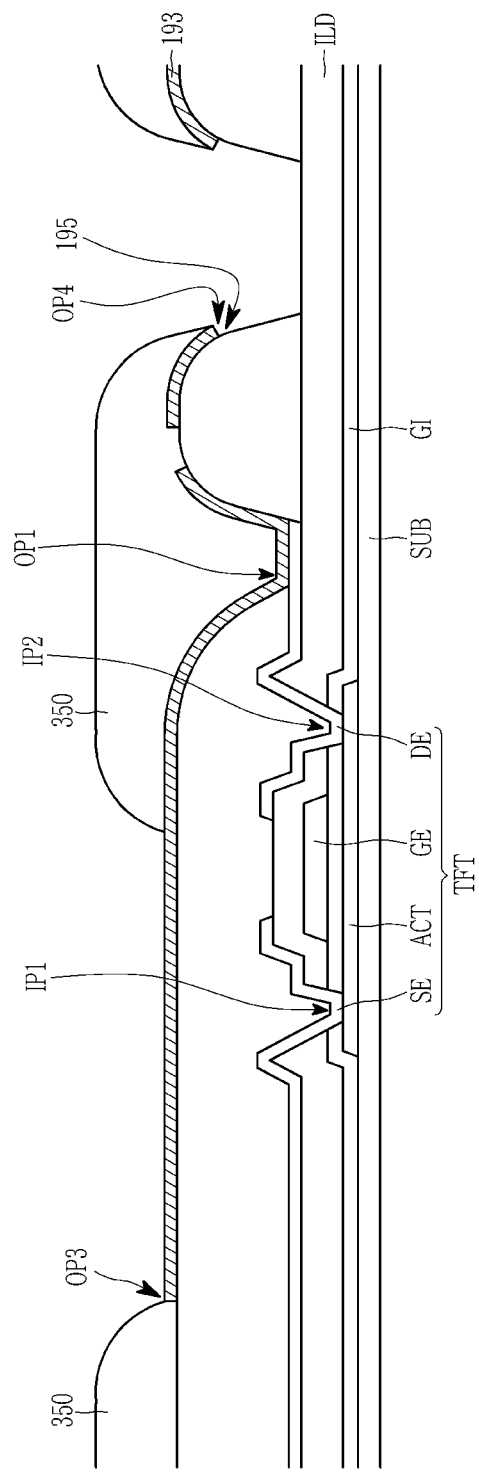

Next, referring to FIG. 10, the partition wall 350 is formed on the first electrode 191 and the auxiliary electrode 193. The partition wall 350 includes the third opening OP3 overlapping the first electrode 191, and the fourth opening OP4 overlapping the second insulation opening OP2 of the insulation film VIA.

Figure 11:
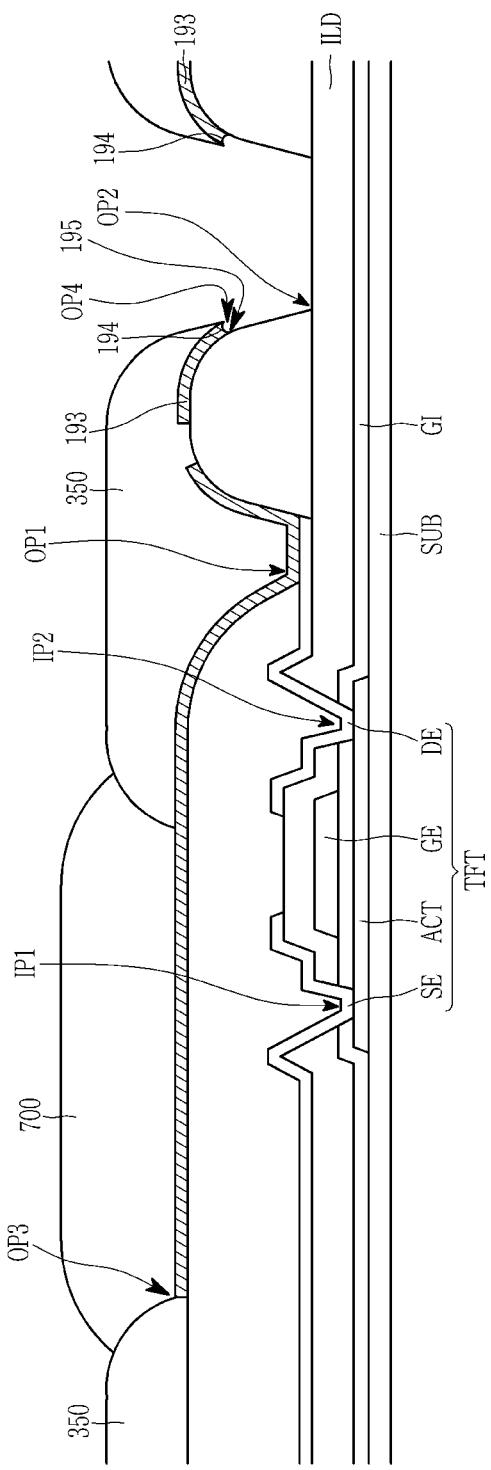

Next, referring to FIG. 11, the photoresist 700 is disposed on the third opening OP3 of the partition wall 350 and the edge of the auxiliary electrode 193 is etched to form the groove 194. As illustrated in FIG. 11, the groove 194 is formed to be inwardly concave at an end of the auxiliary electrode 193. This later becomes an area in which the second electrode 270 contacts the auxiliary electrode 193.

Figure 12:
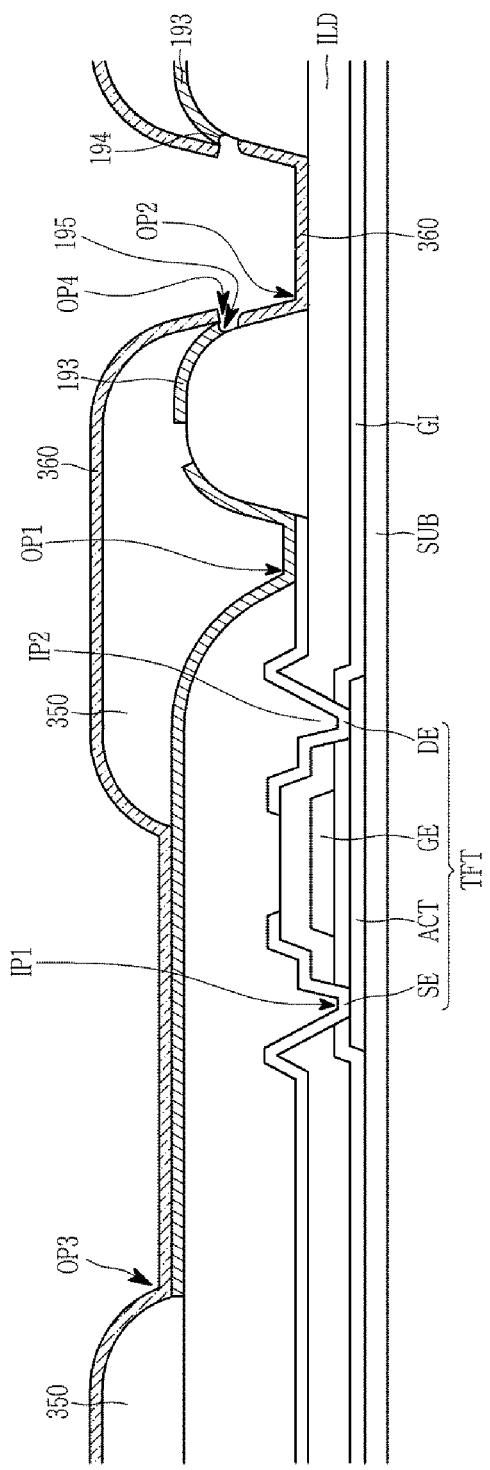

Next, referring to FIG. 12, the emission layer 360 is formed on the first electrode 191 and the partition wall 350. The emission layer 360 is also formed in the second insulation opening OP2 of the partition wall 350. In this case, as described in FIG. 5, the emission layer 360 is not formed in the groove 194 of the auxiliary electrode 193 by the deposition angle when the emission layer 360 is formed, and does not contact the auxiliary electrode 193.

Next, the second electrode 270 is formed on the emission layer 360. As described in FIG. 6, the second electrode 270 is formed at a deposition angle of 20 degrees or less, and is also formed in the groove 194 of the auxiliary electrode 193 and contacts the auxiliary electrode 193. In this way, the display device illustrated in FIG. 2 may be manufactured.

Figure 13:
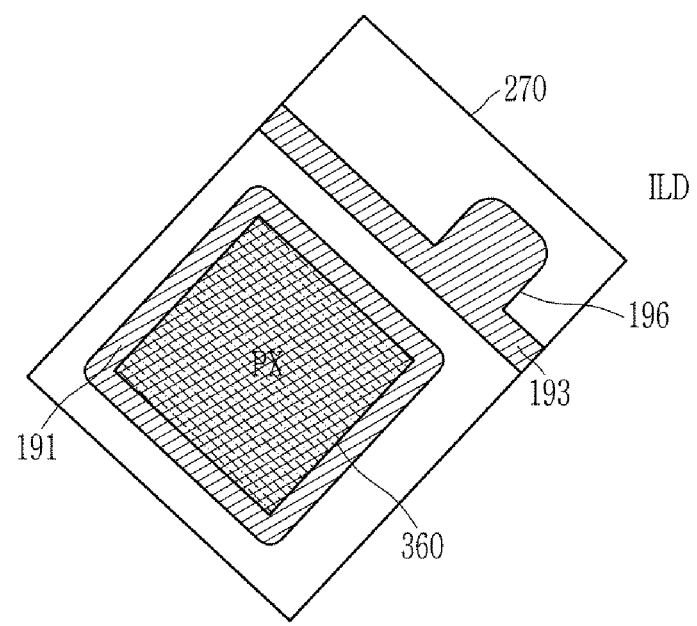
FIG. 13 schematically illustrates a configuration of a first electrode, an auxiliary electrode, an emission layer, and a second electrode for one pixel according to embodiments described herein.

FIG. 13 schematically illustrates configurations of the first electrode 191, the auxiliary electrode 193, the emission layer 360, and the second electrode 270 for one pixel. As illustrated in FIG. 13, the first electrode 191 is disposed to be spaced apart for each pixel PX, and the auxiliary electrode 193 is formed on the same layer as the first electrode 191. A portion of the auxiliary electrode 193 includes a connection part 196 that is connected to the second electrode 270. In FIG. 13, the connection part 196 is illustrated in a configuration protruding from the auxiliary electrode 193, but the connection part 196 may have the same shape as the opening 195 formed in the auxiliary electrode 193 as described above.

As illustrated in FIG. 13, the emission layer 360 is disposed on the first electrode 191. The emission layer 360 may also be disposed for each pixel PX. The second electrode 270 is entirely disposed on the emission layer 360. The second electrode 270 has a plate shape disposed on a plurality of pixels, and is in contact with the auxiliary electrode 193 at the connection part 196. Therefore, it is possible to prevent the voltage drop of the second electrode 270 in the large-area display device.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   a transistor disposed on the substrate;
   a first electrode connected to the transistor;
   an auxiliary electrode disposed on a same layer as the first electrode;
   an emission layer on the first electrode; and
   a second electrode on the emission layer,
   wherein the auxiliary electrode includes an opening that separates a first edge surface of the auxiliary electrode from a second edge surface of the auxiliary electrode in a first direction parallel to an upper surface of the substrate,
   wherein a portion of the second electrode is in the opening of the auxiliary electrode,
   wherein a first end of the portion of the second electrode is opposite a second end of the portion of the second electrode,
   wherein the first edge surface of the auxiliary electrode and the first end of the portion of the second electrode are in direct physical contact with each other at the opening of the auxiliary electrode, and
   wherein the second edge surface of the auxiliary electrode and the second end of the portion of the second electrode are in direct physical contact with each other at the opening of the auxiliary electrode.

2. The display device of claim 1, wherein
   the first edge surface of the auxiliary electrode and the second edge surface of the auxiliary electrode each include a concave shaped groove, and
   the portion of the second electrode is in direct physical contact with the concave shaped groove of each of the first edge surface of the auxiliary electrode and the second edge surface of the auxiliary electrode.

3. The display device of claim 2, wherein
   a portion of the emission layer is disposed in an area overlapping the opening of the auxiliary electrode in a direction perpendicular to a surface of the substrate, and
   the portion of the emission layer and the auxiliary electrode are not in direct contact with each other.

4. The display device of claim 1, further comprising:
   an insulation film between the transistor and the first electrode, wherein
   the insulation film includes a first insulation opening overlapping the transistor in a direction perpendicular to a surface of the substrate,
   a second insulation opening does not overlap the transistor in the direction perpendicular to the surface of the substrate,
   a cross-section of the insulation film disposed between the first insulation opening and the second insulation opening is curved in the direction perpendicular to the surface of the substrate,
   a partition wall is disposed on the insulation film,
   the partition wall including a first partition wall opening adjacent to and overlapping the first electrode, and
   the partition wall including a second partition wall opening overlapping the second insulation opening of the insulation film.

5. The display device of claim 4, wherein
   the second insulation opening of the insulation film overlaps the opening of the auxiliary electrode.

6. The display device of claim 5, wherein
   the auxiliary electrode and the portion of the second electrode are in direct contact within the second insulation opening of the insulation film.

7. A display device comprising:
   a substrate;
   a plurality of transistors disposed on the substrate;
   a plurality of first electrodes respectively connected to the plurality of transistors;
   an auxiliary electrode disposed on a same layer as the plurality of first electrodes and disposed along one direction;

an emission layer disposed on the plurality of first electrodes; and a second electrode having a plate shape and disposed on the emission layer, wherein the auxiliary electrode includes an opening that separates a first edge surface of the auxiliary electrode from a second edge surface of the auxiliary electrode in a first direction parallel to an upper surface of the substrate, wherein a portion of the second electrode is in the opening of the auxiliary electrode, wherein a first end of the portion of the second electrode is opposite a second end of the portion of the second electrode, the first edge surface of the auxiliary electrode and the first end of the portion of the second electrode are in direct physical contact with each other at the opening of the auxiliary electrode, and wherein the second edge surface of the auxiliary electrode and the second end of the portion of the second electrode are in direct physical contact with each other at the opening of the auxiliary electrode.

8. The display device of claim 7, wherein
the first edge surface of the auxiliary electrode and the second edge surface of the auxiliary electrode each include a concave shaped groove, and
the portion of the second electrode is in direct physical contact with the concave shaped groove of each of the first edge surface of the auxiliary electrode and the second edge surface of the auxiliary electrode.

9. The display device of claim 7,
an insulation film between the plurality of transistors and the plurality of first electrodes,
wherein the insulation film includes an opening overlapping the opening of the auxiliary electrode, while
a cross-section of the insulation film adjacent to the opening of the insulation film in a direction perpendicular to a surface of the substrate is curved.

10. The display device of claim 9, wherein
the auxiliary electrode is disposed along a curved surface of the insulation film includes a reflective metal including at least one of calcium, barium magnesium, aluminum, platinum, gold, nickel, neodymium, iridium, chromium, lithium, and calcium.

11. The display device of claim 10, wherein
a portion of the emission layer is disposed within the opening of the insulation film, and
the portion of the emission layer and the auxiliary electrode are not in contact.

12. The display device of claim 11, wherein
the portion of the second electrode is disposed in contact with the portion of the emission layer in the opening of the insulation film.

13. A display device comprising:
a substrate;
a transistor disposed on the substrate;
a first electrode connected to the transistor;
an auxiliary electrode disposed on a same layer as the first electrode;
an emission layer on the first electrode; and
a second electrode on the emission layer,
wherein the auxiliary electrode includes an opening, and
wherein an edge surface of the auxiliary electrode and the second electrode are in direct physical contact at the opening of the auxiliary electrode, and
wherein the emission layer and the second electrode are separated from each other along the edge surface of the auxiliary electrode in direct physical contact with the second electrode, and
a portion of the edge surface of the auxiliary electrode is exposed between the second electrode and the emission layer.

14. The display device of claim 1, wherein a portion of the first edge surface of the auxiliary electrode is between the emission layer and the portion of the second electrode and not covered by the emission layer and the portion of the second electrode.

15. The display device of claim 7, wherein a portion of the first edge surface of the auxiliary electrode is between the emission layer and the portion of the second electrode and not covered by the emission layer and the portion of the second electrode.

* * * * *